(12) United States Patent
Kuriyama

(10) Patent No.: US 7,227,443 B2
(45) Date of Patent: Jun. 5, 2007

(54) FIXED NETWORK RESISTOR

(75) Inventor: Takahiro Kuriyama, Kyoto (JP)

(73) Assignee: Rohm Co., Ltd., Kyoto (JP)

( * ) Notice: Subject to any disclaimer, the term of this patent is extended or adjusted under 35 U.S.C. 154(b) by 196 days.

(21) Appl. No.: 10/533,035

(22) PCT Filed: Oct. 28, 2003

(86) PCT No.: PCT/JP03/13749

§ 371 (c)(1),
(2), (4) Date: Apr. 28, 2005

(87) PCT Pub. No.: WO2004/040591

PCT Pub. Date: May 13, 2004

(65) Prior Publication Data

US 2005/0285713 A1    Dec. 29, 2005

(30) Foreign Application Priority Data

Oct. 31, 2002  (JP) .............................. 2002-317591
Sep. 10, 2003  (JP) .............................. 2003-318684

(51) Int. Cl.
*H01C 1/02* (2006.01)
(52) U.S. Cl. ..................... 338/260; 338/307; 338/320
(58) Field of Classification Search ................ 338/260, 338/262, 307–309, 313, 314, 318, 320, 325, 338/327, 332; 29/610.1, 830
See application file for complete search history.

(56) References Cited

U.S. PATENT DOCUMENTS 4,486,738 A * 12/1984 Sadlo et al. ................. 338/320
5,334,968 A * 8/1994 Negoro ........................ 338/260
5,548,268 A * 8/1996 Collins ........................ 338/307
5,844,468 A   12/1998 Doi et al.
5,850,171 A * 12/1998 Lin et al. ..................... 338/320
2006/0220783 A1* 10/2006 Kuriyama .................... 338/307

FOREIGN PATENT DOCUMENTS

| JP | 2-88206     | 3/1990  |
| JP | 3-64002     | 3/1991  |
| JP | 9-306710    | 11/1997 |
| JP | 2001-143913 | 5/2001  |

* cited by examiner

*Primary Examiner*—Tu Hoang
(74) *Attorney, Agent, or Firm*—Hamre, Schumann, Mueller & Larson, P.C.

(57) ABSTRACT

A fixed resistor network has an insulating substrate, a plurality of film resistors arranged on a top surface of the insulating substrate, terminal electrodes formed for the film resistors on each lengthwise sidewall of the insulating substrate at a given pitch along the sidewall, and recesses provided between the terminal electrodes. The occurrence of solder bridges between the terminal electrodes during solder mounting and the occurrence of chipping in the terminal-electrode-forming areas between the recesses on the lengthwise sidewall are both reduced by making the width of the recesses along the lengthwise sidewall either 0.44 to 0.48 times or 0.525 to 0.625 times the pitch.

10 Claims, 9 Drawing Sheets

PRIOR ART

FIXED NETWORK RESISTOR

TECHNICAL FIELD

The present invention relates to a surface-mount fixed network resistor having a single insulating substrate of rectangular shape on a top surface of which are arranged at least three film resistors, and on a lengthwise side of which are formed terminal electrodes for solder connection for each of the resistor films.

BACKGROUND ART

In a prior-art fixed resistor network of this type having, for example, four film resistors such as that shown in FIGS. 12 to 14, an insulating substrate 1' with a rectangular shape of length L and width W as seen in plan view has four film resistors 2' arranged on a top surface of the substrate 1' in the lengthwise direction thereof and has, for both ends of each film resistor 2', terminal electrodes 4' which are formed on both lengthwise sidewalls 3' of the insulating substrate 1'. The fixed resistor network is surface mounted on a printed board by soldering each of the terminal electrodes 4'.

In addition, the prior art provides recesses 5' in areas between the terminal electrodes 4' on both lengthwise sidewalls 3' of the insulating substrate 1'. When individual terminal electrodes 4' are formed on both lengthwise sidewalls 3', the individual recesses 5' reliably separate these individual terminal electrodes 4' from each other (see, for example, Japanese Examined Patent Publication No. S6-18123). A cover coat 7' made of a material such as glass is formed on the top surface of the insulating substrate 1' so as to cover each of the film resistors 2'.

Fixed resistor networks having the above construction must satisfy the following conditions.

(a) When the fixed resistor network is mounted on a printed board by soldering, of the individual terminal electrodes 4' for both ends of the individual film resistors 2', the occurrence of solder bridging between neighboring terminal electrodes 4' must be low.

(b) When individual terminal electrodes 4' are formed on both lengthwise sidewalls 3' of the insulating substrate 1' by the application and drying or firing of a conductive paste, connection of the conductive paste within a recess 5' between neighboring terminal electrodes 4' must be infrequent.

(c) The occurrence of the chipping or breaking off of material in terminal-electrode-forming areas 6' between recesses 5' on the lengthwise sidewalls 3' of insulating substrate 1' must be low.

(d) The frequency of cracking of the insulating substrate 1' at the recesses 5' must be low.

To address these requirements, prior-art fixed resistor networks have a construction in which, letting the pitch of the terminal electrodes 4' along the lengthwise sidewalls 3' of the insulating substrate 1' be P, the width A' at areas 6' where the terminal electrodes 4' are formed (referred to below as "terminal-electrode-forming areas") between the recesses 5' on the lengthwise sidewalls 3' has been set to A'=approx. 0.6×P; the width B' along the lengthwise direction 3' of insulating substrate 1' at the recesses 5'has been set to B'=approx. 0.4×P, and the depth C' at each recess 5' from the lengthwise direction 3' has been set approximately equal to the width A' at the terminal-electrode-forming areas 6'.

This type of construction has led to the following sorts of problems.

That is, in fixed resistor networks of a size where the pitch P between the terminal electrodes 4' has been set to 0.5 mm, the width B' of the recesses 5' becomes 0.4×0.5=approx. 0.2 mm, which is small. When these fixed network chip resistors are surface mounted by soldering onto a printed board or the like, there is a strong possibility that solder bridging will occur so as to connect, of the above individual terminal electrodes 4', neighboring terminal electrodes 4' separated by a recess 5'.

In fixed resistor networks of a size where the pitch P between the terminal electrodes 4' has been set to 0.4 mm, the width B' of the recesses 5' becomes B'=0.4×0.4=approx. 0.16 mm, which is even smaller. During solder mounting, the occurrence of solder bridges between neighboring terminal electrodes 4' in such cases becomes very high.

Moreover, in fixed resistor networks of a size where the pitch P has been set to 0.4 mm, the depth C' at each recess 5' is C'=0.24 mm. At a resistor size having a pitch P of 0.4 mm, the width W of the insulating substrate 1' is 0.6 mm, and so the depth C' to width W ratio for the insulating substrate 1' becomes large, resulting in frequent cracking of the insulating substrate 1' at these recesses 5'. Furthermore, as the depth C' at the recesses 5' increases, the projecting length at the terminal-electrode-forming areas 6' positioned between these recesses 5' increases, resulting in more frequent chipping or breaking off of material in these terminal-electrode-forming areas 6'.

On the other hand, as the depth C' at the recesses 5' decreases, when the terminal electrodes 4' are formed by applying a conductive paste to the terminal-electrode-forming areas 6' situated between the recesses 5', the conductive paste often extends into the recess 5' from both sides and connects therein.

It is an object of the invention to provide a fixed resistor network which overcomes these problems.

DISCLOSURE OF THE INVENTION

In a first aspect, the invention provides a fixed resistor network having an insulating substrate of rectangular shape in plan view, at least three film resistors formed on a top surface of the insulating substrate at a suitable pitch in a lengthwise direction of the insulating substrate, terminal electrodes formed for the film resistors on a lengthwise sidewall of the insulating substrate, and recesses provided between the terminal electrodes, a pitch between the terminal electrodes along the sidewall being at least 0.5 mm, wherein each recess has a width along the lengthwise sidewall which is from 0.44 to 0.48 times the pitch of the terminal electrodes, and terminal-electrode-forming areas between the recesses have a width along the lengthwise sidewall which is from 0.56 to 0.52 times the pitch of the terminal electrodes.

During the soldering of fixed resistor networks, to eliminate solder bridging between neighboring terminal electrodes across an intervening recess, the width of the recess between the terminal electrodes should be made larger than the width of the terminal-electrode-forming areas of the insulating substrate.

However, making the width of the recesses larger than the width of the terminal-electrode-forming areas without increasing the pitch of the terminal electrodes means that the width of the terminal-electrode-forming areas will be smaller, reducing the strength of these areas and leading to a higher occurrence of defects such as the chipping or breaking off of material.

We therefore studied the relationship between the width of the terminal-electrode-forming areas and the width of the recesses when the pitch between the terminal electrodes is held constant, whereupon we found that it is desirable to set the width of the recesses at 0.44 to 0.48 times the pitch of the terminal electrodes and to set the width of the terminal-electrode-forming areas between the recesses at 0.56 to 0.52 times the pitch.

That is, by having the width of the terminal-electrode-forming areas between the recesses and the width of the recesses satisfy the above conditions, the chipping or breaking off of material at the terminal-electrode-forming areas can be reliably prevented without increasing the pitch of the film resistors, and thus without making the insulating substrate larger. At the same time, during soldering, solder bridging between neighboring terminal electrodes across an intervening recess can be greatly reduced.

In a second aspect, the invention provides a fixed resistor network having an insulating substrate of rectangular shape in plan view, at least three film resistors formed on a top surface of the insulating substrate at a suitable pitch in a lengthwise direction of the insulating substrate, terminal electrodes formed for the film resistors on a lengthwise sidewall of the insulating substrate, and recesses provided between the terminal electrodes, a pitch between the terminal electrodes along the sidewall being not more than 0.4 mm; wherein each recess has a width along the lengthwise sidewall of the insulating substrate which is from 0.525 to 0.625 times the pitch of the terminal electrodes, and terminal-electrode-forming areas between the recesses have a width along the lengthwise sidewall of the insulating substrate which is from 0.475 to 0.375 times the pitch of the terminal electrodes.

In this arrangement, when the pitch between the terminal electrodes is 0.4 mm, the width of the recesses along the lengthwise sidewalls of the insulating substrate becomes 0.21 to 0.25 mm, and the width of the terminal-electrode-forming areas between the recesses along the lengthwise sidewalls of the insulating substrate becomes 0.19 to 0.15 mm. As illustrated in detail below in the following embodiments, this has the effect of making it possible to satisfy at the same time conditions (a), (b) and (c) required of fixed resistor networks.

Moreover, in this second aspect of the invention, as noted above, in addition to making the width of the recesses along the lengthwise sidewall of the insulating substrate from 0.525 to 0.625 times the pitch of the terminal electrodes and making the width of the terminal-electrode-forming areas between the recesses along the lengthwise sidewall of the insulating substrate from 0.475 to 0.375 times the pitch of the terminal electrodes, by also setting the depth of the recesses from the lengthwise sidewall of the insulating substrate to from 0.512 to 0.645 times the width of the terminal-electrode-forming areas, the depth of the recesses from the lengthwise sidewall of the insulating substrate becomes 0.077 to 0.12 mm. This has the effect of, in addition to above conditions (a), (b) and (c), also satisfying at the same time above condition (d).

BEST MODE FOR CARRYING OUT THE INVENTION

Figure 1:
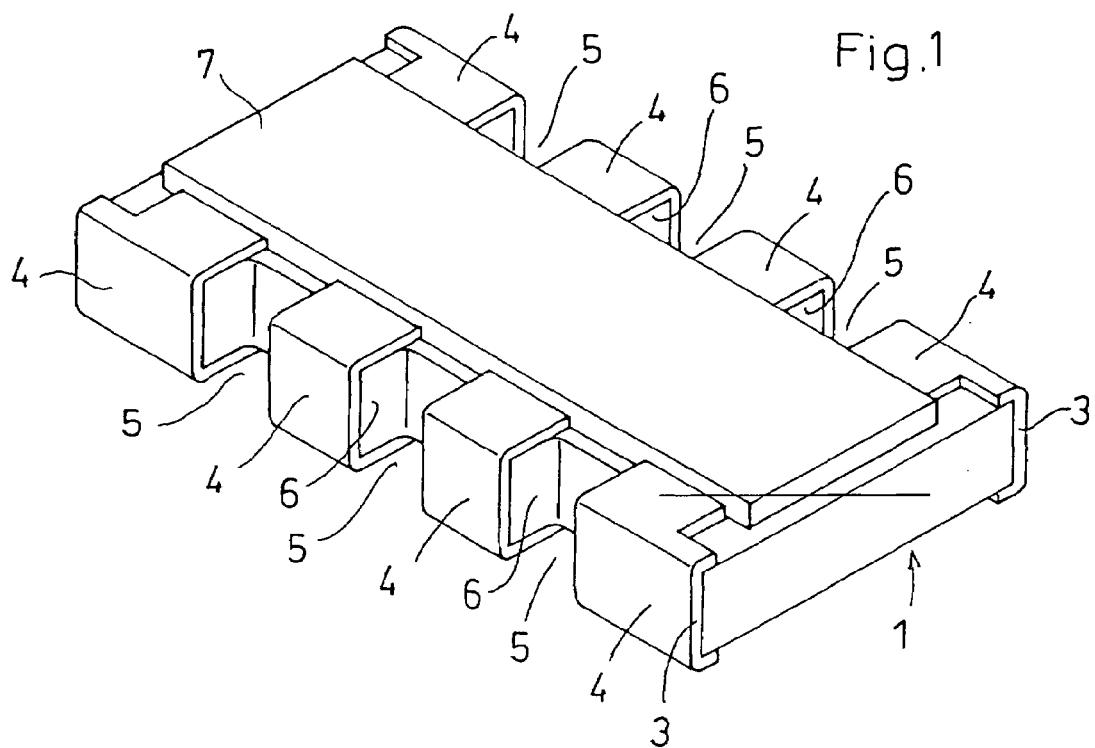
FIG. 1 is a perspective view of a first embodiment of the invention.
Figure 2:
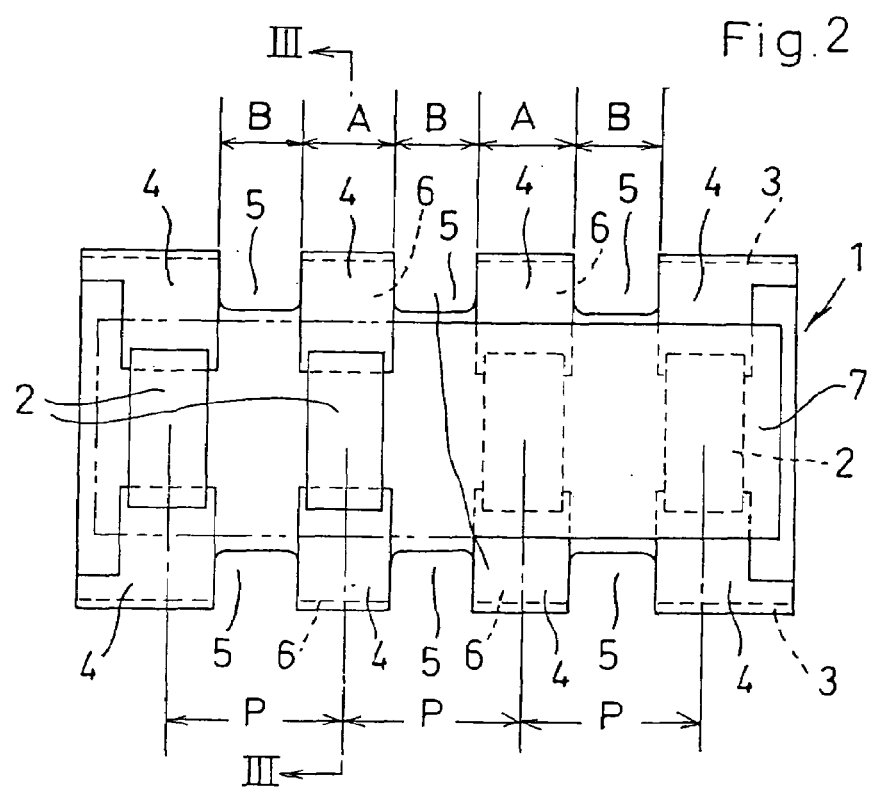
FIG. 2 is a plan view of the same embodiment.
Figure 3:
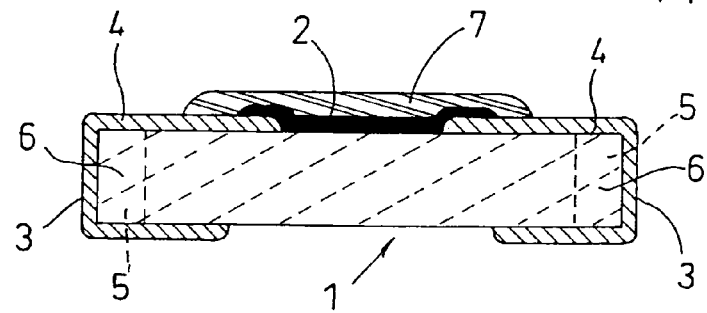
FIG. 3 is an enlarged cross-sectional view taken along III—III in FIG. 2.
Figure 4:
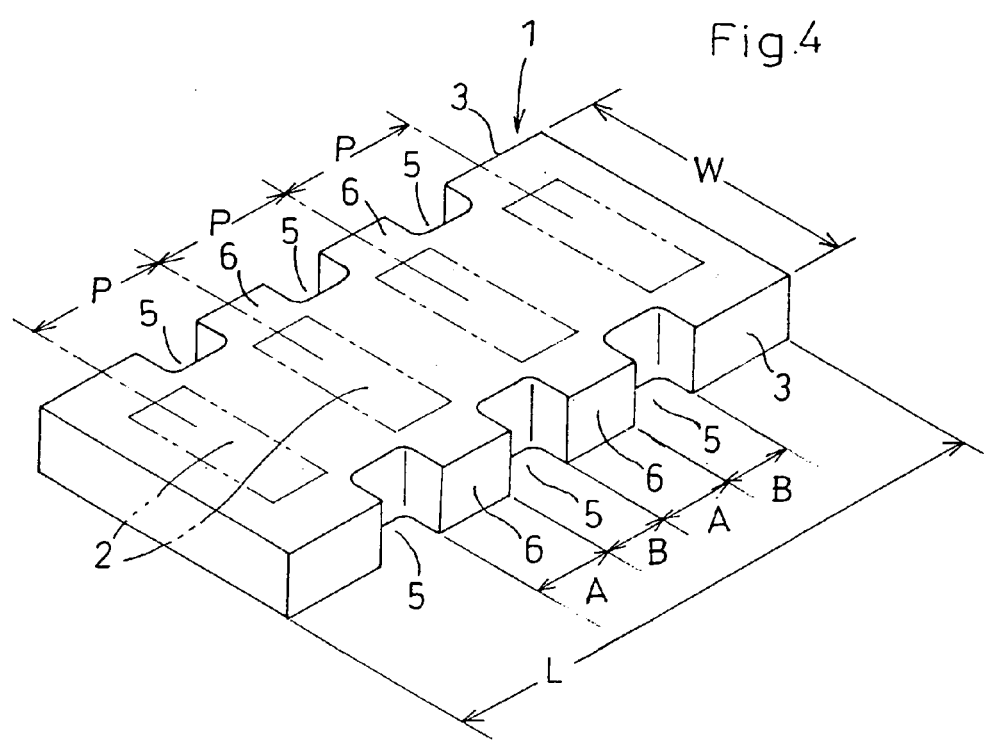
FIG. 4 is a perspective view showing the insulating substrate used in the first embodiment.

Embodiments of the invention are described below in conjunction with the attached diagrams.

FIGS. 1 to 4 show a first embodiment of the invention.

In these diagrams, the symbol 1 represents a ceramic insulating substrate having, in a plan view, a rectangular shape with a length L of 2.0 mm and a width W of 1.0 mm. This insulating substrate 1 has formed, on a top surface thereof, four film resistors 2 which are arranged in the lengthwise direction of the insulating substrate 1.

Terminal electrodes 4 which are electrically connected to both ends of each film resistor 2 are formed on both longitudinal sidewalls 3 of the insulating substrate 1 at a pitch P=0.5 mm along the longitudinal sidewalls 3. Recesses 5 are provided in areas between the individual terminal electrodes 4 on both of the lengthwise sidewalls 3 of the insulating substrate 1.

Each terminal electrode 4 is formed so as to extend to a bottom surface of the insulating substrate 1. On the top surface of the insulating substrate 1, a cover coat 7 made of a material such as glass is formed so as to cover each film resistor 2.

Each recess 5 has a width B along the lengthwise sidewall 3 such that B=0.46×P=0.23 mm. Between these recesses 5 are areas 6 where the terminal electrodes 4 are formed, i.e., terminal-electrode-forming areas 6, each of which has a width A along the lengthwise sidewall 3 such that A=0.54×P=0.27 mm.

In experiments we carried out, compared with the prior art, the above arrangement was able to greatly reduce the occurrence of defects such as the chipping or breaking off of material at the terminal-electrode-forming areas 6. At the same time, during mounting of the fixed resistor network onto a printed board or the like by soldering, compared with the prior art, the above arrangement was able to greatly reduce the occurrence of solder bridging between, of the above terminal electrodes 4, those neighboring terminal electrodes 4 separated by a recess 5.

We also found from experiments that it is desirable to set the width B of the recesses 5 to B=(0.48 to 0.44)×P and to set the width A of the terminal-electrode-forming areas 6 to A=(0.52 to 0.56)×P.

That is, when the terminal-electrode-forming areas 6 had a width A greater than 0.56×P=0.28 mm and the recesses 5 had a width B less than 0.44×P=0.22 mm, the frequency of solder bridging between neighboring terminal electrodes 4 separated by a recess 5 increased. When the terminal-electrode-forming areas 6 had a width A less than 0.52×P=0.26 mm and the recesses 5 had a width B greater than 0.48×P=0.24 mm, the frequency of defects such as the chipping or breaking off of material at the terminal-electrode-forming areas 6 increased.

Figure 5:
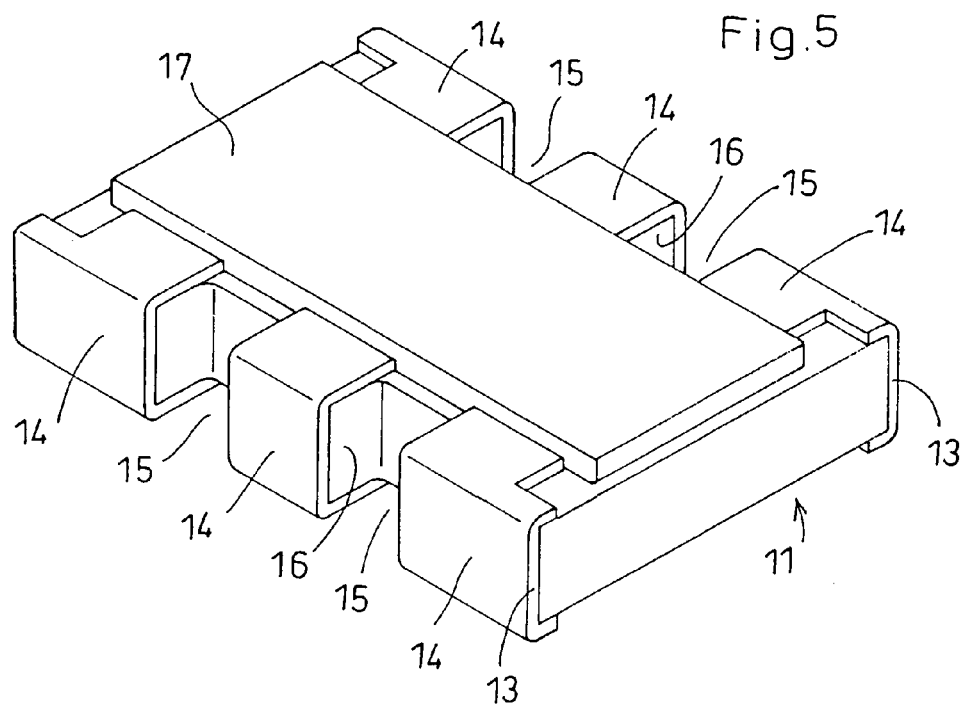
FIG. 5 is a perspective view of a second embodiment of the invention.
Figure 6:
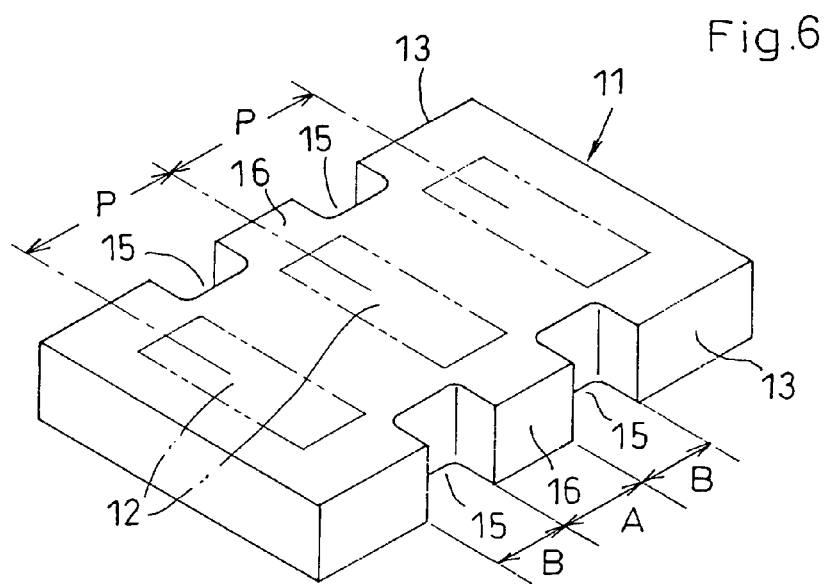
FIG. 6 is a perspective view showing the insulating substrate used in the second embodiment.

Next, FIGS. 5 and 6 show a second embodiment of the invention.

This second embodiment is a three-element fixed resistor network composed of a single insulating substrate 11, of rectangular shape in a plan view, on which three film resistors 12 are arranged. Terminal electrodes 14 for both ends of the individual film resistors 12 are formed on both lengthwise sidewalls 13 of the insulating substrate 11 at a pitch P=0.5 mm along the lengthwise sidewalls 3, and recesses 15 are provided between the terminal electrodes 14. In addition, a cover coat 17 is formed on a top surface of the insulating substrate 11.

In this embodiment as well, by setting the terminal-electrode-forming areas 16 between the recesses 15 to a width A along the lengthwise sidewalls 13 such that A=(0.52 to 0.56)×P and setting the recesses 15 to a width B along the lengthwise sidewalls 13 such that B=(0.48 to 0.44)×P, defects such as the chipping or breaking off of material in the terminal-electrode-forming areas 16 can be reliably reduced. At the same time, during mounting of the fixed resistor network onto a printed board or the like by soldering, the occurrence of solder bridging between neighboring electrodes 14 separated by a recess 15 can be reliably reduced.

Figure 7:
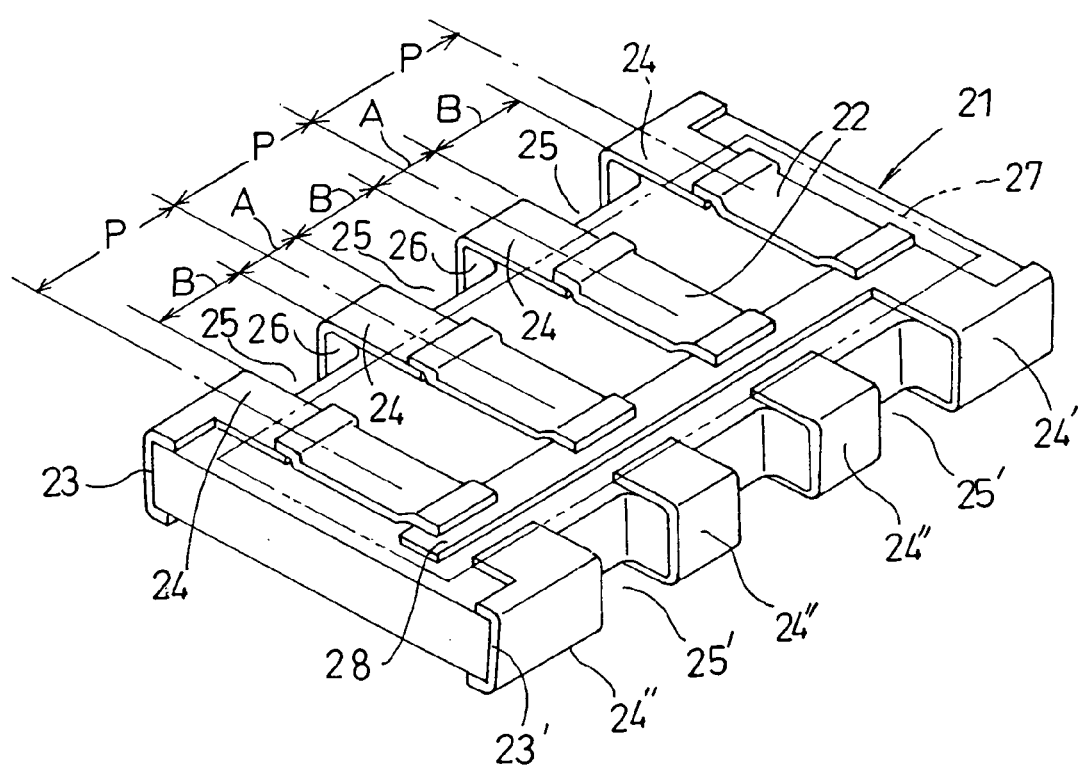
FIG. 7 is a perspective view of a third embodiment of the invention.

FIG. 7 shows a third embodiment of the invention.

This third embodiment is a fixed resistor network in which the pitch P between the terminal electrodes has been set at 0.5 mm. In this device, on one lengthwise sidewall 23 of the lengthwise sidewalls 23 and 23' of an insulating substrate 21, terminal electrodes 24 are formed to the above pitch P=0.5 mm at one end of each of four film resistors 22 arranged on a top surface of the insulating substrate 21, and recesses 25 are provided between these individual terminal electrodes 24. On the other lengthwise sidewall 23' of the lengthwise sidewalls 23 and 23' of the insulating substrate 21, at least one common terminal electrode 24' which is electrically connected through a conductor pattern 28 to the other end of the four film resistors 22 is separately formed. Moreover, a cover coat 27 is formed on the top surface of the insulating substrate 21.

In this arrangement, as in the first embodiment described above, by giving the terminal-electrode-forming areas 26 between the recesses 25 on one lengthwise sidewall 23 of the insulating substrate 21 a width A=(0.52 to 0.56)×P and by giving the recesses 25 a width B=(0.48 to 0.44)×P, as noted above, defects such as the chipping or breaking off of material at the terminal-electrode-forming areas 26 can be reliably reduced and, during mounting of the fixed resistor network onto a printed board or the like by soldering, the occurrence of solder bridging between neighboring terminal electrodes 24 separated by a recess 25 can be reliably reduced.

Moreover, in this third embodiment, dummy terminal electrodes 24" and recesses 25' therebetween are provided on the other lengthwise sidewall 23' of the insulating substrate 21, in the same manner as the individual terminal electrodes 24 and recesses 25 on the first lengthwise sidewall 13.

Obviously, this invention is not limited to three-or four-element fixed resistor networks having three or four film resistors on one insulating substrate as in the foregoing embodiments, and may also be applied to multi-element fixed network resistance having five or more film resistors.

Figure 8:
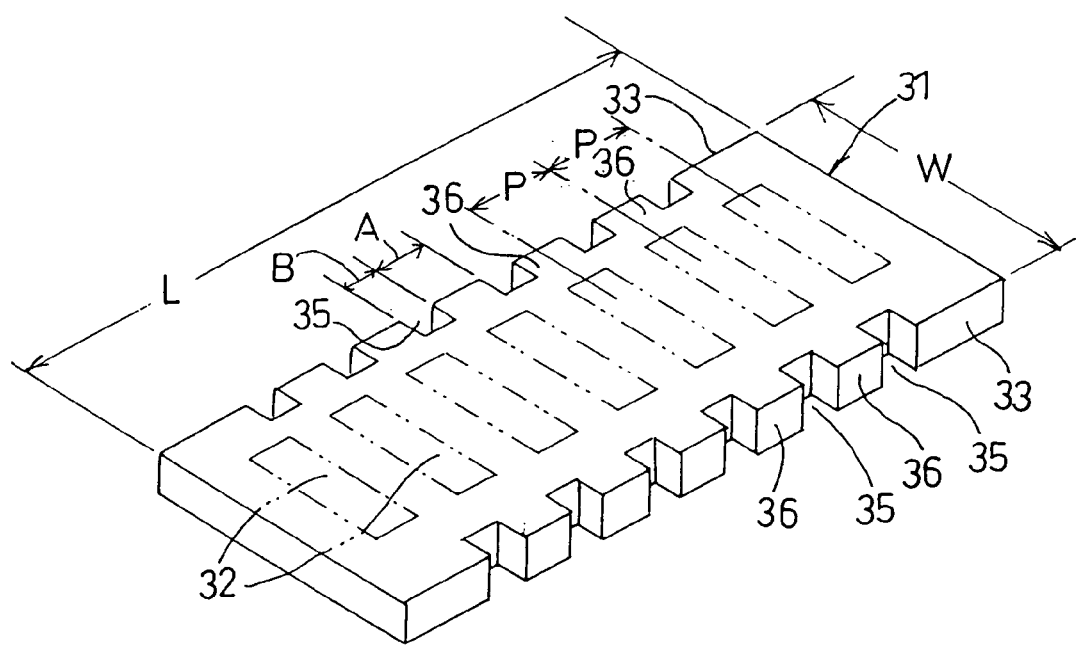
FIG. 8 is a perspective view showing the insulating substrate used in a fourth embodiment of the invention.

FIG. 8 shows a fourth embodiment of the invention.

This fourth embodiment is a multi-element fixed resistor network having an insulating substrate 31 with a length L of 3.8 mm and a width W of 1.6 mm. Terminal-electrode-forming areas 36 for the formation of terminal electrodes at both ends of each film resistor 32 formed on a top surface of the insulating substrate 31 are provided at a pitch P=0.5 mm along lengthwise sidewalls 33 of the insulating substrate 31. Recesses 35 are provided between these terminal-electrode-forming areas 36.

In this embodiment too, as described above, by giving the terminal-electrode-forming areas 36 between recesses 35 provided on the lengthwise sidewalls 33 of the insulating substrate 31 a width A=(0.52 to 0.56)×P and by giving the recesses 35 a width B=(0.48 to 0.44)×P, defects such as the chipping or breaking off of material at the terminal-electrode-forming areas 36 can be reliably reduced and, during mounting of the fixed resistor network onto a printed board or the like by soldering, the occurrence of solder bridging between neighboring terminal electrodes separated by a recess 35 can be reliably reduced.

Figure 9:
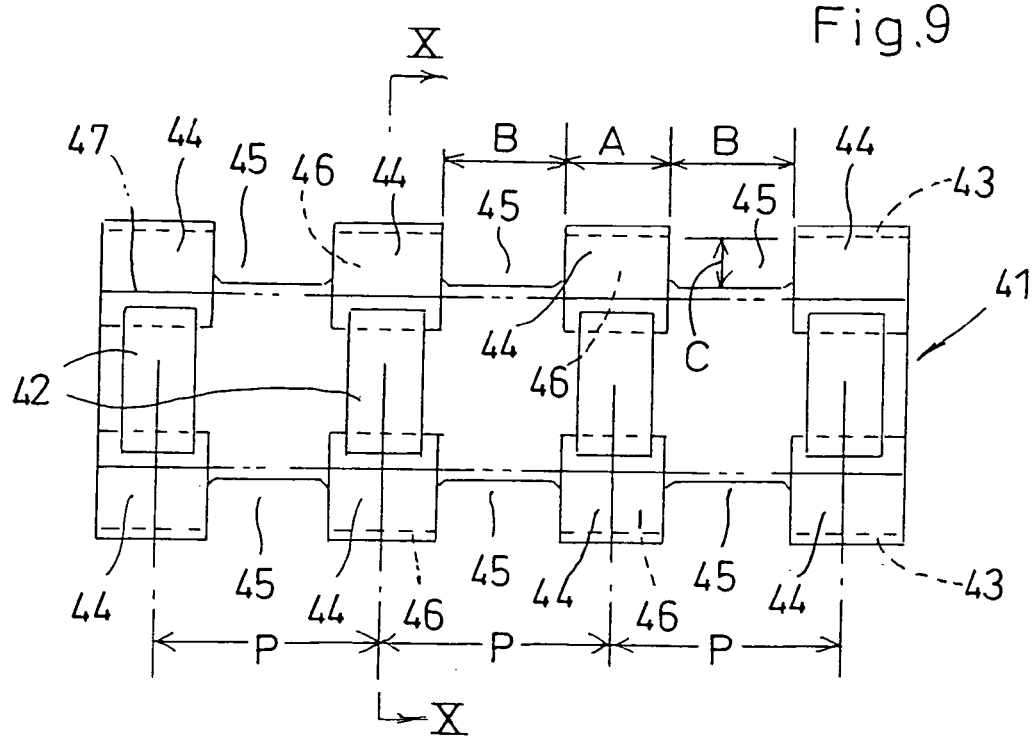
FIG. 9 is a plan view showing a fifth embodiment of the invention.
Figure 10:
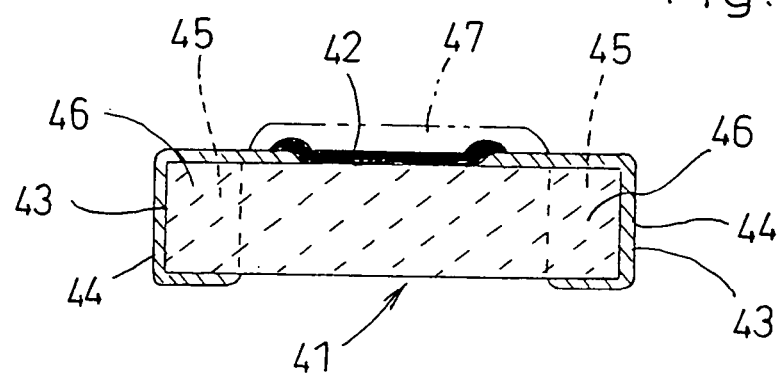
FIG. 10 is an enlarged cross-sectional view taken along X—X in FIG. 9.
Figure 11:
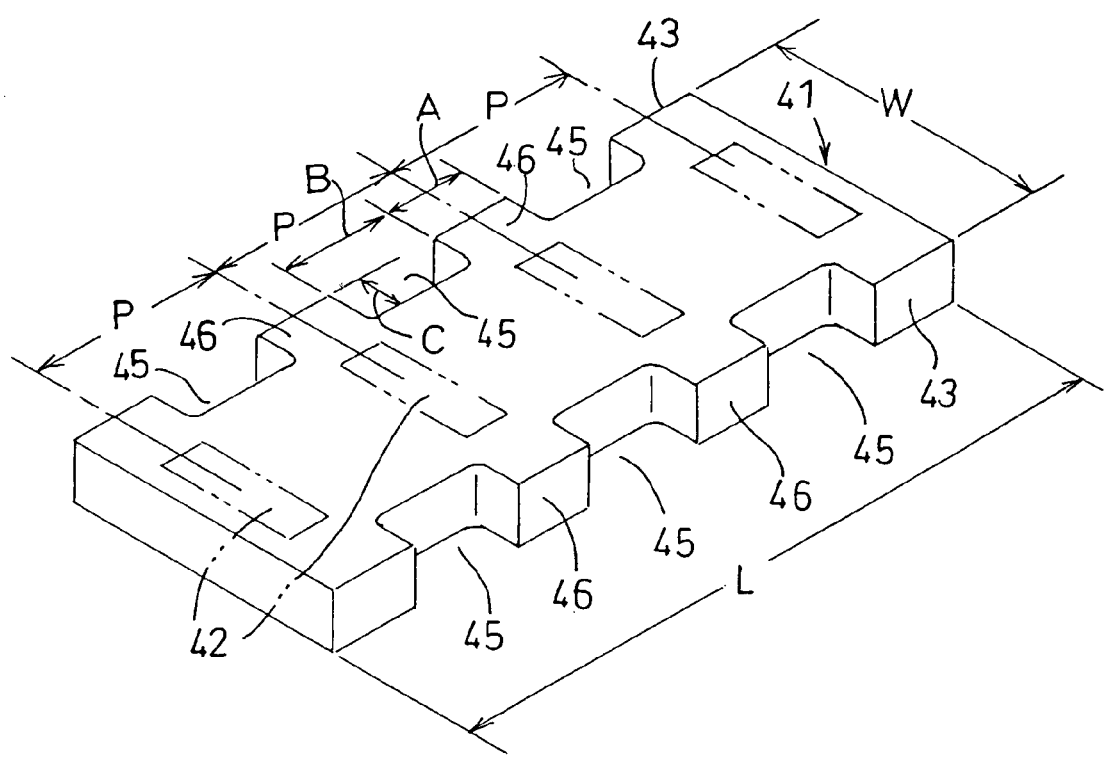
FIG. 11 is a perspective view showing the insulating substrate used the fifth embodiment.
Figure 12:
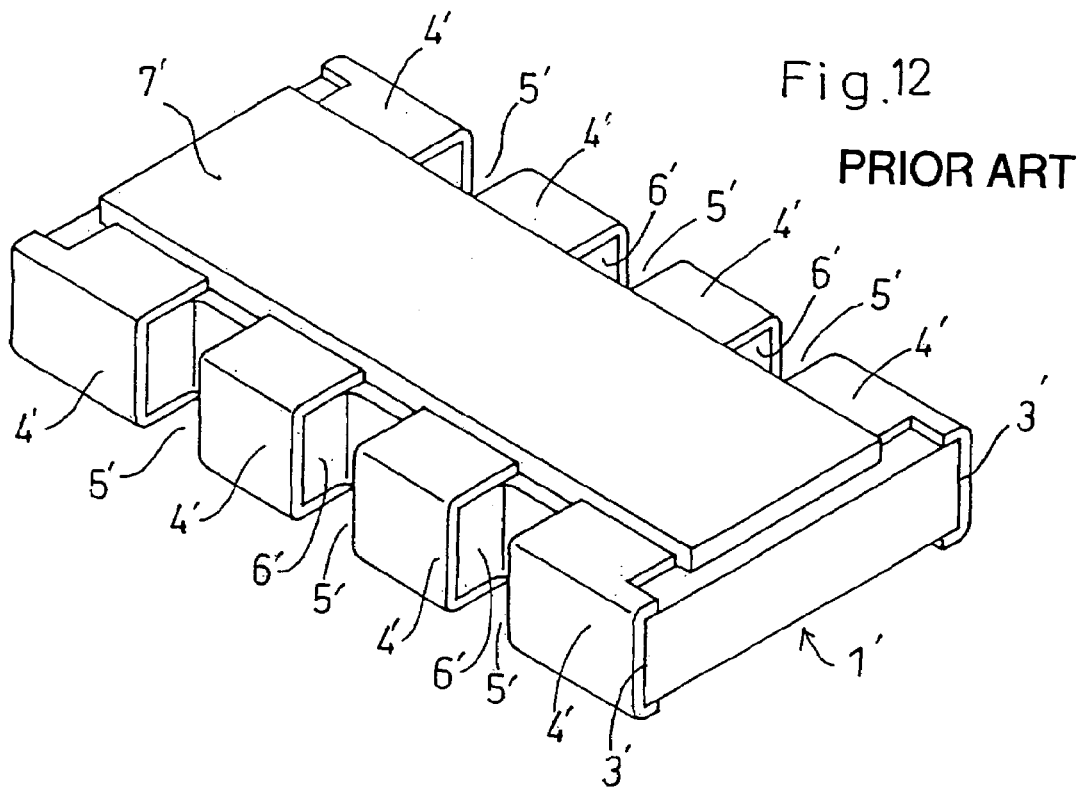
FIG. 12 is a perspective view showing a fixed resistor network according to the prior art.
Figure 13:
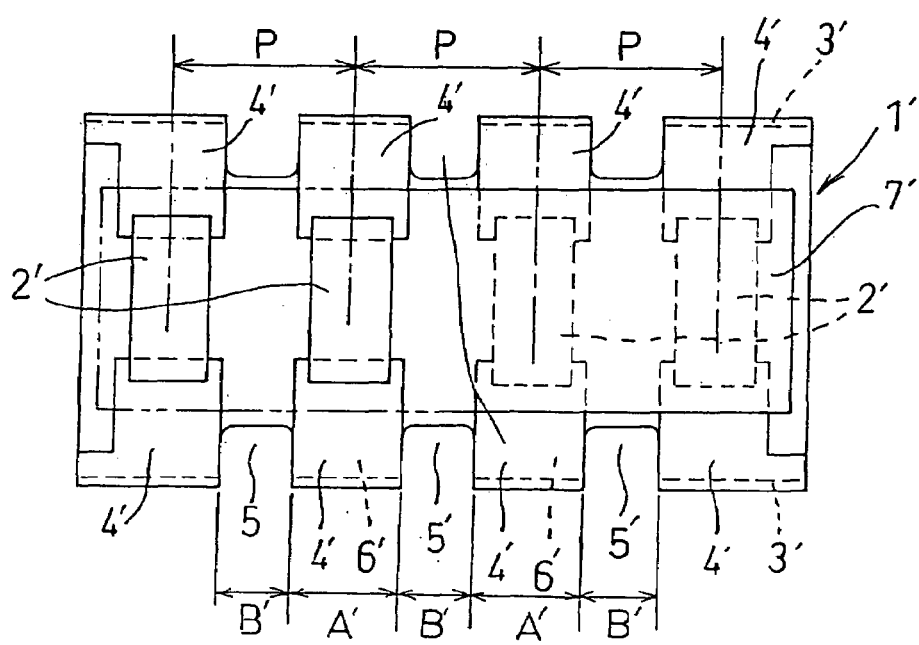
FIG. 13 is a plan view of the same prior-art fixed resistor network.
Figure 14:
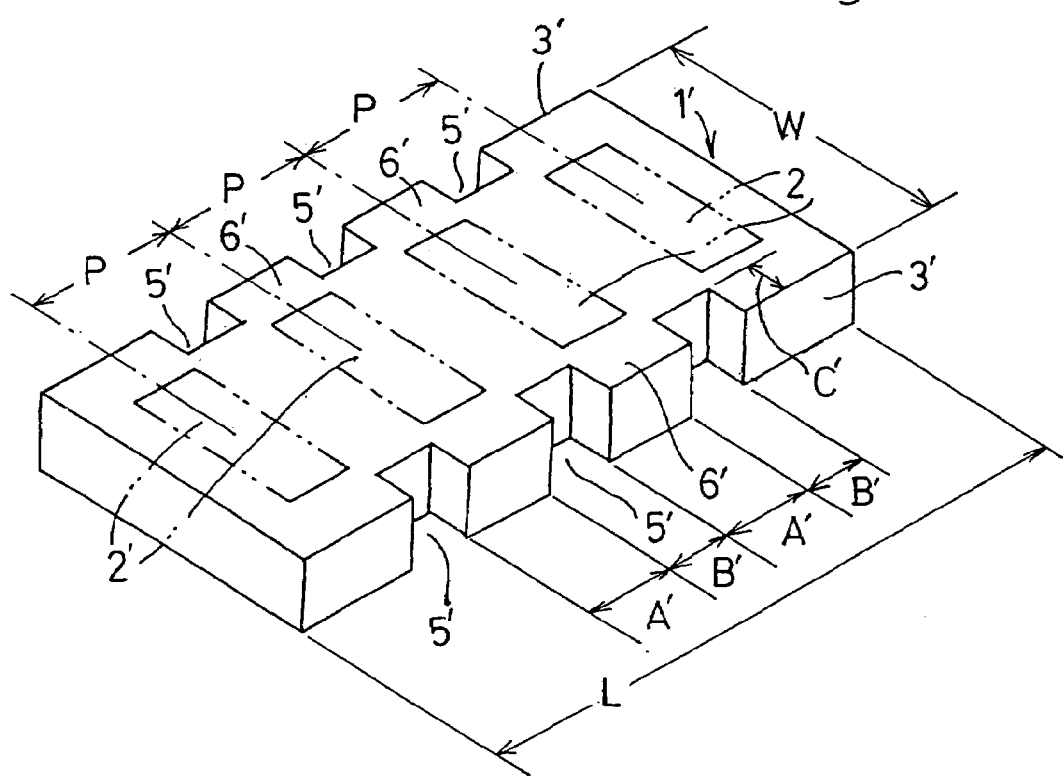
FIG. 14 is a perspective view showing the insulating substrate used in the same prior-art fixed resistor network.

FIGS. 9 to 11 show a fifth embodiment of the invention.

This embodiment is a four-element fixed resistor network in which the pitch P between the terminal electrodes was set at 0.4 mm.

In these diagrams, the symbol 41 represents a ceramic insulating substrate having, in a plan view, a rectangular shape with a length L of 1.39 mm and a width W of 0.6 mm. This insulating substrate 41 has formed, on a top surface thereof, four film resistors 42 so as to be arranged in the lengthwise direction of the insulating substrate 41.

Terminal electrodes 44 that are electrically connected to both ends of the film resistors 42 are formed, on lengthwise sidewalls 43 at both edges of the insulating substrate 41, at a pitch P=0.4 mm along the lengthwise direction of the insulating substrate 41.

Recesses 45 having a width B along the lengthwise sidewall 43 and a suitable depth C from the lengthwise sidewall 43 are provided in areas between the terminal electrodes 44 on the lengthwise sidewalls 43 of the insulating substrate 41. In other words, terminal-electrode-forming areas 46 having a width A along the lengthwise sidewall 43 are provided in areas between the recesses 45 on both lengthwise sidewalls 43, with a portion of the terminal electrodes 44 being formed at these terminal electrode-formed areas 46.

Each of the terminal electrodes 44 extends to a bottom surface of the insulating substrate 41. Moreover, a cover coat 47 made of a material such as glass is formed on the top surface of the insulating substrate 41 so as to entirely cover all the film resistors 42.

On both the lengthwise sidewalls 43 of the insulating substrate 41, the width A of the terminal-electrode-forming areas 46 between the recesses 45 is set at A=P×(0.475 to 0.375) such as to make A=0.19 to 0.15 mm, and the width B of the recesses 45 is set at B=P×(0.525 to 0.625) such as to make B=0.21 to 0.25 mm.

Moreover, the depth C of each recess 45 from the lengthwise sidewall 43 is set at 0.512 to 0.645 times the width A of the terminal-electrode-forming areas 46, i.e., C=A×(0.512 to 0.645), such as to make C=0.077 to 0.12 mm.

In experiments, we found that during mounting of the fixed resistor network onto a printed board or the like with solder, the frequency of solder bridging between neighboring terminal electrodes 44 separated by a recess 45 from among the terminal electrodes 44 changes markedly at a recess 45 width W of 0.20 mm. That is, by giving each recess 45 a width B of 0.20 mm or more, the frequency of solder bridging can be reduced to about one-tenth or less the frequency when the width B is less than 0.20 mm.

We have also found from experiments that when terminal electrodes 44 are formed at the terminal-electrode-forming areas 46 by applying a conductive paste, connection of the conductive paste within the recess 45 between the electrodes changes markedly at a recess 45 depth C of approximately 0.077 mm. That is, by setting the depth to 0.077 mm or more, the frequency of such conductive paste connections across recesses 45 can be reduced to about one-tenth or less the frequency when the depth C is less than 0.077 mm.

Based on these results and assuming the above dimensions to have somewhat of a margin of safety, we concluded that the width B of the recesses 45 is set to preferably at least 0.21 mm, i.e., B=P×0.525 or more, and the depth C of the recesses 45 is set to preferably at least 0.077 mm, i.e., C=A×0.512 or more.

Yet, although the occurrence of solder bridging between the terminal electrodes 44 can be reduced by making the width B of the recesses 45 larger, increasing this width B decreases the width A of the terminal-electrode-forming areas 46. Moreover, although the occurrence of conductive paste connections between terminal electrodes 44 can be reduced by increasing the depth C of the recesses 45, increasing the depth C increases the length of the terminal-electrode-forming areas 46. This gives the terminal-electrode-forming areas 46 a narrower shape, resulting in more frequent chipping or breaking off of material at the terminal-electrode-forming areas 46. Moreover, increasing the depth C of the recesses 45 results in a higher frequency of cracking in the area of the recesses 45 on both lengthwise edges of the insulating substrate 41.

We thus carried out experiments on the relationship between the width A of the terminal-electrode-forming areas 46 and the width C of the recesses 45.

The results showed that, by setting the width A of the terminal-electrode-forming areas 46 to at least 0.15 mm, i.e., A=P×0.375 or more, and setting the depth C of the recesses 45 to not more than 0.12 mm, i.e., C=A×0.645 or less, it is possible to greatly reduce both the frequency of the chipping or breaking off of material at the terminal-electrode-forming areas 46 and the frequency of cracking in the area of the recesses 45 of the insulating substrate 41.

The invention claimed is:

1. A fixed resistor network comprising an insulating substrate of rectangular shape in plan view, at least three film resistors formed on a top surface of the insulating substrate at a suitable pitch in a lengthwise direction of the insulating substrate, terminal electrodes formed for the film resistors on a lengthwise sidewall of the insulating substrate, and recesses provided between the terminal electrodes, a pitch between the terminal electrodes along the sidewall being at least 0.5 mm;

wherein each recess has a width along the lengthwise sidewall which is from 0.44 to 0.48 times the pitch of the terminal electrodes, and terminal-electrode-forming areas between the recesses have a width along the lengthwise sidewall which is from 0.56 to 0.52 times the pitch of the terminal electrodes.

2. The fixed resistor network according to claim 1, wherein the terminal electrodes, recesses and terminal-electrode-forming areas are provided on both lengthwise sidewalls of the insulating substrate.

3. The fixed resistor network according to claim 1, wherein the terminal electrodes, recesses and terminal-electrode-forming areas are provided on at least one of the two lengthwise sidewalls of the insulating substrate.

4. The fixed resistor network according to any one of claims 1 to 3, wherein the pitch between the terminal electrodes is 0.5 mm or approximately 0.5 mm.

5. The fixed resistor network according to any one of claims 1 to 3, wherein the insulating substrate has a length L of approximately 2.0 mm and a width W of approximately 1.0 mm.

6. The fixed resistor network according to any one of claims 1 to 3, wherein the insulating substrate has a length L of approximately 3.8 mm and a width W of approximately 1.6 mm.

7. A fixed resistor network comprising an insulating substrate of rectangular shape in plan view, at least three film resistors formed on a top surface of the insulating substrate at a suitable pitch in a lengthwise direction of the insulating substrate, terminal electrodes formed for the film resistors on a lengthwise sidewall of the insulating substrate, and recesses provided between the terminal electrodes, a pitch between the terminal electrodes along the sidewall being not more than 0.4 mm;

wherein each recess has a width along the lengthwise sidewall of the insulating substrate which is from 0.525 to 0.625 times the pitch of the terminal electrodes, and terminal-electrode-forming areas between the recesses have a width along the lengthwise sidewall of the insulating substrate which is from 0.475 to 0.375 times the pitch of the terminal electrodes.

8. The fixed resistor network according to claim 7, wherein the recesses have a depth from the lengthwise sidewall of the insulating substrate which is from 0.512 to 0.645 times the width of the terminal-electrode-forming areas.

9. The fixed resistor network according to claim 7, wherein the recesses have a width along the lengthwise sidewall of the insulating substrate of 0.21 to 0.25 mm and the terminal-electrode-forming areas between the recesses have a width along the lengthwise sidewall of the insulating substrate of 0.19 to 0.15 mm.

10. The fixed resistor network according to claim 8, wherein the recesses have a depth of 0.077 to 0.12 mm from the lengthwise sidewall of the insulating substrate.

* * * * *